United States Patent
Nakashima et al.

(10) Patent No.: US 6,936,878 B2
(45) Date of Patent: Aug. 30, 2005

(54) SEMICONDUCTOR MEMORY DEVICE WITH REDUCED MEMORY CELL AREA

(75) Inventors: Yasushi Nakashima, Hyogo (JP); Takashi Izutsu, Hyogo (JP); Yoshiyuki Ishigaki, Hyogo (JP)

(73) Assignee: Renesas Technology Corp., Tokyo (JP)

(*) Notice: Subject to any disclaimer, the term of this patent is extended or adjusted under 35 U.S.C. 154(b) by 106 days.

(21) Appl. No.: 10/626,594

(22) Filed: Jul. 25, 2003

(65) Prior Publication Data

US 2004/0150019 A1 Aug. 5, 2004

(30) Foreign Application Priority Data

Feb. 4, 2003 (JP) ........................................ 2003-026968

(51) Int. Cl.[7] .......................................... H01L 27/108
(52) U.S. Cl. ........................ 257/296; 257/303; 257/306; 257/315; 257/903
(58) Field of Search .............................. 257/303, 306, 257/315, 903

(56) References Cited

U.S. PATENT DOCUMENTS 6,479,860 B2 * 11/2002 Ohbayashi .................. 257/315

FOREIGN PATENT DOCUMENTS

| JP | 62-257698 | 11/1987 |
|---|---|---|
| JP | 6-291281 | 10/1994 |
| JP | 7-161840 | 6/1995 |

OTHER PUBLICATIONS

Naiki, et al. "Center Wordline Cell: A New Symmetric Layout Cell for 64Mb SRAM" International Electron Devices Meeting Technical Digest, Washington, D.C. (Dec. 5–8, 1993) pp. 33.3.1–33.3.4.

* cited by examiner

Primary Examiner—David Nelms
Assistant Examiner—Mai-Huong Tran
(74) Attorney, Agent, or Firm—McDermott Will & Emery LLP

(57) ABSTRACT

A semiconductor memory device includes a memory cell, and first and second capacitive elements. The memory cell has a pair of inverters each including first and second driver nMOS transistors and first and second TFTs, and first and second access nMQS transistors. The first and second capacitive elements is connected to the drain of first and second access nMOS transistors, the drain of first and second driver nMOS transistors, and the drain of first and second TFTs. The gate width of first and second driver nMOS transistors is set at most 1.2 times longer than the gate width of first and second access nMOS transistors.

10 Claims, 10 Drawing Sheets

SEMICONDUCTOR MEMORY DEVICE WITH REDUCED MEMORY CELL AREA

BACKGROUND OF THE INVENTION

1. Field of the Invention

The present invention relates to a semiconductor memory device, and specifically, to the layout of each element in a memory cell in a semiconductor memory device.

2. Description of the Background Art

Conventionally, DRAM (Dynamic Random Access Memory) and SRAM (Static Random Access Memory) are known as semiconductor memory devices.

DRAM is a semiconductor memory device having memory cells each configured with one MOS (Metal Oxide Semiconductor) transistor and one capacitor. Since such a simple configuration of memory cells is suitable for achieving higher integration and larger capacity of a semiconductor device, it is used for various electronic equipment.

SRAM usually includes two access MOS transistors, two driver MOS transistors, and two load MOS transistors or resistance elements. The exemplary configuration of a memory cell of SRAM is disclosed in, for example, Japanese Patent Laying-Open Nos. 6-291281, 7-161840, 62-257698.

Pseudo-SRAM is also known, which uses memory cells of DRAM and has the same interface as SRAM.

In DRAM, however, a refresh operation is necessary to retain memory, and a writing/reading operation to/from a memory cell being refreshed can not be performed. Accordingly, during a refresh operation of a memory cell, writing/reading operation for that memory cell must be stopped temporarily until the refresh operation is completed. Further, since a large amount of current is consumed for the refresh operation, the data retention time is shorter than SRAM when the stored contents are retained by a battery or the like.

As for SRAM, though the refresh operation is not necessary, the occupying area of one memory cell is larger than DRAM, since the number of elements forming one memory cell, such as MOS transistors, is larger. Accordingly, it is difficult to attain a large capacity, and the cost per one bit (per-bit cost) is higher than DRAM.

On the other hand, pseudo-SRAM is capable of attaining a large capacity, since it employs DRAM memory cells, but it still requires the refresh operation. The refresh operation from the outside can be eliminated if a self-refresh function is employed, but the refresh operation must be performed during writing and reading operations. As such, the period for writing and reading operations and the period for the refresh operation are included in one cycle, and hence the cycle time becomes longer than in a normal SRAM. Additionally, since a refresh current flows, current consumption will become larger than in a normal SRAM, and hence the data retention period of the battery will become shorter.

SUMMARY OF THE INVENTION

As above, there are problems inherent in DRAM, SRAM and pseudo-SRAM, respectively. Accordingly, the object of the present invention is to provide a semiconductor memory device which does not require the refresh operation, with approximately the same cycle time and current consumption as in a normal SRAM, and with smaller memory cell occupying area as compared to a normal SRAM.

A semiconductor memory device according to the present invention includes a memory cell, an interlayer insulation film and a capacitive element. The memory cell is formed on a semiconductor substrate, and has a pair of inverters each including a driver MOS (Metal Oxide Semiconductor) transistor and a load element, and an access MOS transistor. The interlayer insulation film covers the access MOS transistor, the driver MOS transistor and the load element. The capacitive element is formed on the interlayer insulation film, and electrically connected to drain of the access MOS transistor, drain of the driver MOS transistor, and the load element. The gate width of the driver MOS transistor is at most 1.2 times longer than the gate width of the access MOS transistor.

Since the semiconductor memory device according to the present invention includes memory cells each having a pair of inverters each including a driver MOS transistor and a load element, and access MOS transistor, the refresh operation is no longer required and the cycle time and power consumption approximately the same with that of a normal SRAM can be attained. Additionally, since the gate width of the driver MOS transistor is set to be at most 1.2 times larger than that of the access MOS transistor, the occupying area of a memory cell can be made smaller than in a normal SRAM.

A semiconductor memory device according to the present invention has a plurality of memory cells arranged in an array and includes a flip-flop of said memory cells having a pair of inverters formed of driver MOS transistors and load elements, a pair of access MOS transistors of said memory cells electrically connected to input nodes of the inverters respectively, an interlayer insulation film covering the access MOS transistors and the driver MOS transistors, a pair of capacitive elements of the memory cells formed on the interlayer insulation film and electrically connected to the input nodes of the inverters, a word line electrically connected to gate electrodes of the pair of access MOS transistors and extending in the same direction as an extending direction of gate electrodes of the driver MOS transistors and disposed between said gate electrodes of the driver MOS transistors, a pair of active region patterns formed by integrating a pair of active regions of the access MOS transistors with a pair of active regions of the driver MOS transistors and extending in a direction orthogonal to an extending direction of said word line and a pair of bit lines extending in a direction orthogonal to the extending direction of the word line and electrically connected to active regions of the access MOS transistors respectively. A length of the memory cells in the extending direction of the word line is longer than that in an extending direction of said bit lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, referring to FIGS. 1–15, embodiments of the present invention will be described.

First Embodiment

Figure 1:
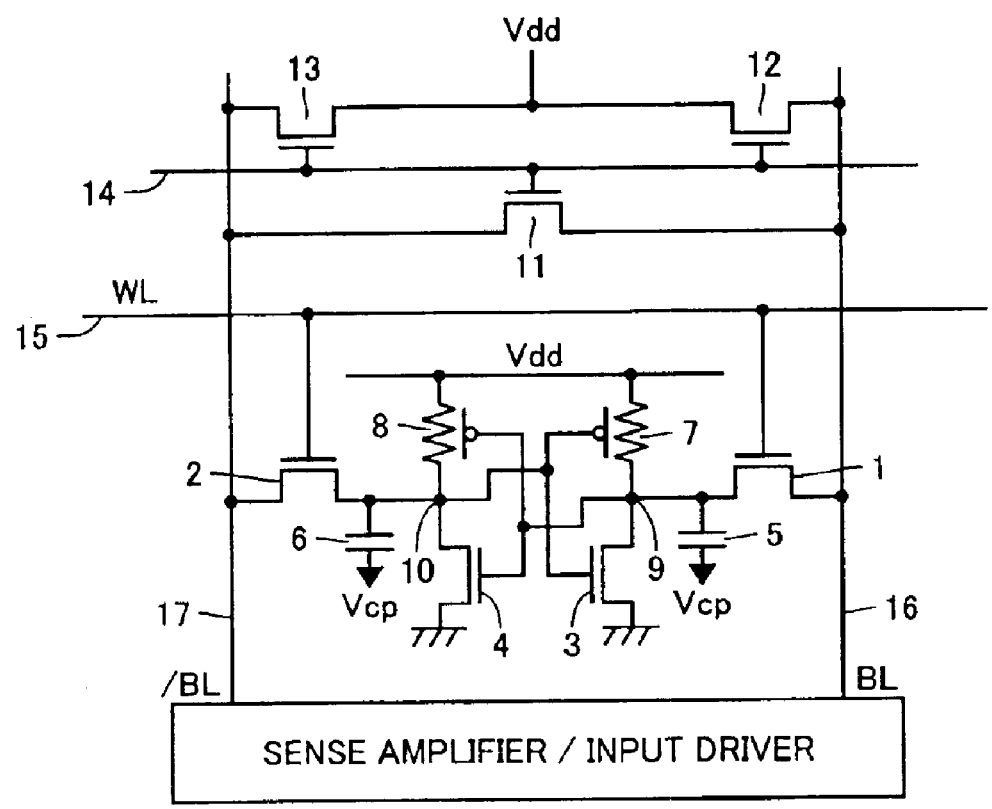
FIG. 1 is an equivalent circuit diagram of a memory cell of a semiconductor memory device according to a first embodiment of the present invention.

FIG. 1 is an equivalent circuit diagram of a memory cell of a semiconductor memory device according to a first embodiment of the present invention. The semiconductor memory device includes a memory cell array region where memory cells are formed, and a peripheral circuitry region where peripheral circuitry for controlling the operation of the memory cells is formed.

A memory cell includes, as shown in FIG. 1, first and second inverters, and two access nMOS transistors 1, 2. The first inverter includes a first driver nMOS transistor 3 and a first TFT (a p-type Thin Film Transistor) 7, while the second inverter includes a second driver nMOS transistor 4 and a second TFT 8.

The first and second inverters form a flip-flop having respective inputs connected to the other's outputs, and the drain of first access nMOS transistor 1 is connected to a first memory node 9 of the flip flop, and the drain of second access nMOS transistor 2 is connected to a second memory node 10 of the flip flop.

The gates of first and second access nMOS transistors 1, 2 are connected to a word line (WL) 15, while the sources of first and second access nMOS transistors 1, 2 are connected to a bit line (BL) 16 and a bit line (/BL) 17, respectively. The sources of first and second TFT 7, 8 are connected to power supply (Vdd), while the drains of first and second TFT 7, 8 are connected to first and second memory nodes 9, 10, respectively. The sources of first and second driver nMOS transistors 3, 4 are connected to ground lines (GND lines), while the drains of first and second driver nMOS transistors 3, 4 are connected to first and second memory nodes 9, 10, respectively.

Then, first and second capacitive elements (capacitors) 5, 6 are connected to first and second memory nodes 9, 10, respectively. The gate length and the gate width of first and second access nMOS transistors 1, 2 are set to be approximately equal to that of first and second driver nMOS transistors 3, 4.

In FIG. 1, potential Vcp is the potential of the opposing electrode (upper electrode) of a capacitor which will be described below, and in the present embodiment it is half as much as Vdd potential. However, potential Vcp may be the same level as Vdd, or may be GND level.

In a normal SRAM, when access transistors and driver transistors are of the same size, a current flowing into one memory node from one bit line via one access transistor in a reading operation raises the potential of the memory node higher than the inverted threshold value of the other inverter having that memory node as an input. Thus, the data may be destructed.

Thus, it has conventionally been recognized that the ideal ratio between the size of an access transistor and an drive transistor is about 1:3. Setting the size of the access transistor smaller than that of the driver transistor, it is intended to increase the amount of current flowing into GND from the driver transistor, reducing the amount of current flowing into the memory node.

Accordingly, in a conventional SRAM, the driver transistor must be larger than the access transistor. This has been one factor of the increase in memory cell size.

On the other hand, in the memory cell of the semiconductor memory device according to the present embodiment, since an access transistor and driver transistor may be of approximately the same size, the size of both of the transistors may be the minimum transistor size that is compliant with a process rule. Accordingly, a driver transistor may be made smaller than a conventional transistor, and consequently, the memory cell area can be reduced.

In the present embodiment, in an attempt to have an access transistor and a driver transistor of approximately the same size as described above, a capacitive element of about 10 fF–30 fF is connected to a memory node, or the resistance value at a contact part of access transistor and/or driver transistor and another element is appropriately adjusted. Specifically, for example, the resistance value at the contact part of an access transistor and a bit line is set to about 21–100 kΩ, for example, while the resistance value of the contact part of a driver transistor and a ground line (GND line) is set to about 20 kΩ at most, for example, thus setting the resistance value of the contact part of the access transistor and the bit line larger than the other one.

As above, by providing a capacitive element or by adjusting the contact resistance, even when an access transistor and a driver transistor are of approximately the same size, the amount of current flowing into a memory node can appropriately be adjusted, and a data destruction during a reading operation can be prevented.

It should be noted that the size of the transistors may not to be exactly the same, and may be varied by about 20%, considering the effect of other layout patterns, such as the arrangement of contacts. Additionally, it is preferable that the size of driver transistor is set larger than that of access transistor in order to stabilize a reading operation as much as possible.

In a memory cell pattern, which will be described later, the memory cell size is not affected even when the gate width of driver transistor is 1.2 times larger than that of access transistor. The memory cell size is largely affected by the change in the gate width rather than gate length. As such, it is preferred to set the gate width of a driver MOS transistor at least 0.8 times and at most 1.2 times as large as that of an access MOS transistor.

Next, the operation of the semiconductor memory device according to the present embodiment will be described.

First, a reading operation will be described. It is assumed that the potential of second memory node 10 is at ground (GND) level, and the potential of first memory node 9 is at Vdd level. In a reading operation, bit line (BL) 16 and bit line (/BL) 17 are both precharged to Vdd level by precharge nMOS transistors 12, 13 and an equalize nMOS transistor 11. The level of a signal line 14 is at least Vdd plus the threshold voltage (Vth) of precharge nMOS transistors 12, 13 in order to set the bit lines at Vdd level. It should be noted that the level of signal line 14 may be at Vdd level if PMOS transistors are used for the precharge transistors or the equalize transistors.

Next, when the precharging is completed, with signal line 14 set at GND level and bit line (BL) 16 and bit line (/BL) 17 not being charged or discharging, word line 15 is charged to a potential higher than Vdd from GND level. The potential herein is at least Vdd+the threshold voltage (Vth) of the access transistors.

When word line 15 attains the potential above, second access nMOS transistor 2 is charged from bit line (/BL) 17. The charges thus provided charge second capacitive element (capacitor) 6 and the potential of second memory node 10 raises from GND level.

Then the potential difference occurs between the source and the drain of second driver nMOS transistor 4, discharging the charges to GND line. The bit line capacitance, source-drain current value of an access transistor, the capacitance of a capacitive element, the source-drain current value of a driver transistor are set such that the potential of second memory node 10 at this time does not exceed the inverted threshold value of the inverter including first TFT 7 and first driver nMOS transistor 3, which has second memory node 10 as an input.

For example, the bit line capacitance value may be set about 200 fF, the capacitance of capacitive element may be set about 25 fF, the maximum value of the current that transiently passes through an access nMOS transistor may be set about 15 $\mu$A, and the maximum value of the current passing through driver nMOS transistor may be set about 9 $\mu$A.

Further, in order to adjust the value of the current flowing through an access nMOS transistor, it is possible to lower the impurity concentration of source/drain of access nMOS transistor intentionally to increase the resistance value of source/drain.

For example, source/drain of access nMOS transistor may be formed by injecting phosphorous (P) or arsenic (As) by approximately $1\times10^{13}$–$1\times10^{14}$ (cm$^{-2}$), and in addition to the above injection, source/drain of driver nMOS transistor may be formed by injecting phosphorous (P) or arsenic (As) by approximately $1\times10^{15}$–$6\times10^{15}$ (cm$^{-2}$).

On the other hand, the opposing first memory node 9 is maintained approximately at Vdd level, since the bit line precharge potential is Vdd and the potential of word line 15 is at Vdd+threshold voltage (Vth). Therefore, a potential difference occurs between bit line (BL) 16 and bit line (/BL) 17. By amplifying the potential difference by a sense amplifier, a data of the memory cell can be read.

A writing operation is performed as follows. It is assumed that the potential of second memory node 10 is at GND level, and the potential of first memory node 9 is at Vdd level. First, by a scheme as in the reading operation, bit line (BL) 16 and bit line (/BL) 17 are precharged to Vdd level.

Next, signal line 14 is set at GND level, and word line 15 is set at Vdd+threshold voltage (Vth). Then, a write data is output to bit line from an input driver. At this time, in order to store GND level in first memory node 9 and Vdd level in second memory node 10, bit line (BL) 16 should be set at GND level and bit line (/BL) 17 should be set at Vdd level.

Thus, the charges stored in first capacitive element 5 is pulled-down to bit line (BL) 16, setting the level of first memory node 9 lower than the inverted threshold value of the inverter formed by a second TFT 8 and second driver nMOS transistor 4, which has first memory node 9 as an input. At this time, the amount of the current provided from first TFT 7 is sufficiently smaller than the amount of current discharged to bit line (BL) 16 via first access nMOS transistor 1.

This inversion of the inverter starts charging of second capacitive element 6 from bit line (/BL) 17 that is at Vdd. Finally, first memory node 9 is charged to GND level, while second memory node 10 is charged to Vdd level. Thus, the writing operation ends.

Next, data retention will be described. As in SRAM, a data is latched with a flip-flop configuration. In other words, since the refresh operation as in DRAM is not necessary, a data can be retained with the power consumption as small as TFT type SRAM.

Further, by connecting capacitive elements to memory nodes, soft error tolerability can drastically be improved. As used herein, a soft error is a malfunction of memory due to an information destruction caused by a noise of electron-positive hole pairs, which occur by an a line emitted from U or Th included in a package passing through a semiconductor substrate.

Figure 15:
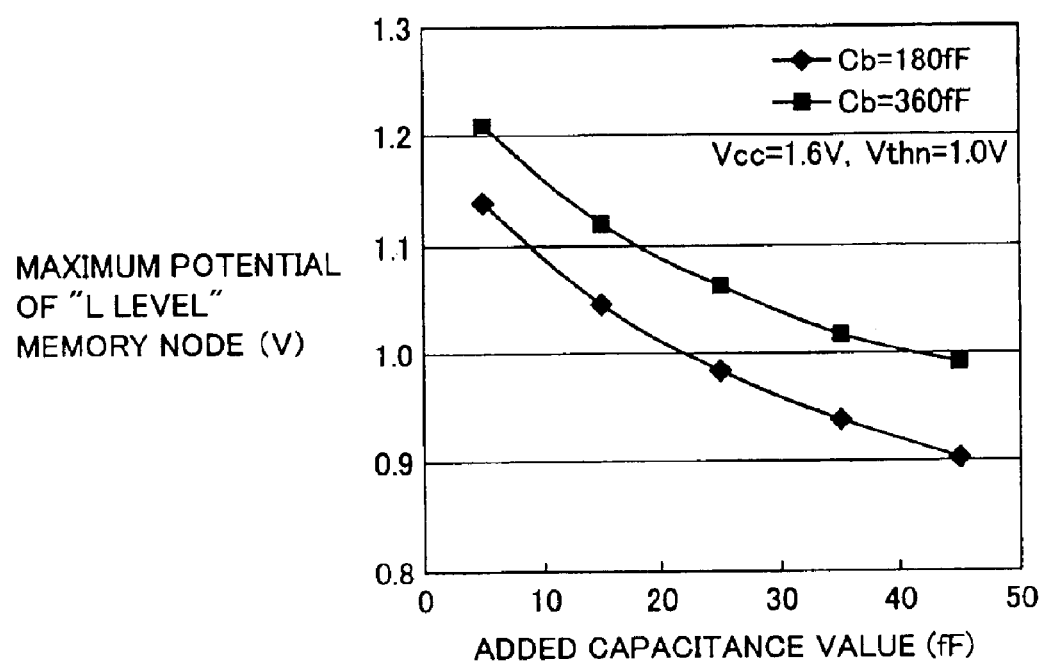
FIG. 15 is a graph showing the relationship between the capacitance value of a capacitor and the maximum potential of a memory node in a reading operation.

Next, conditions when non-destructive reading is performed will be described, in which a data in a memory cell is not destructed during a reading operation. Referring to FIG. 15, the dependency of the maximum potential of a memory node on the capacitance value of a capacitor during a reading operation will be described. The ordinate and the abscissa indicate the capacitance value of a capacitor and the maximum potential of a memory node.

In FIG. 15, the curve plotted by rhombus indicates where parasitic capacitance of the bit line is 180 fF, and the curve plotted by square indicates where parasitic capacitance of the bit line is 360 fF. The supply voltage Vdd is 1.6V, and the threshold voltage Vthn of nMOS transistor is about 1.0V.

The maximum potential of the memory node takes on the value of 1.0V when the capacitance value of the capacitor is 23 fF and the parasitic capacitance of bit line is 180 fF, and when the capacitance value of the capacitor is 43 fF and the parasitic capacitance of bit line is 180 fF. Therefore, if a capacitor having capacitance value larger than 23 fF is provided when the parasitic capacitance of the bit line is 180 fF, then the potential of the memory node does not exceed 1.0V that is the threshold voltage of nMOS transistor. Then, even when the cell ratio of the memory cell is 1, the stored data will not be inverted, and the stored data will be read without destruction.

Assuming that the maximum potential is 1.0V, the ratio of the parasitic capacitance of bit line to the capacitance of memory cell is about 7.8 when the parasitic capacitance of the bit line is 180 fF, and about 8.3 when the parasitic capacitance of the bit line is 360 fF. This is larger than the normal capacitance ratio of bit line to memory cell in DRAM, which is about 3.

Though the maximum potential is set to 1.0V in the example above, it is preferred to decrease the threshold voltage in order to lower the supply voltage, and hence the maximum potential above should preferably be decreased. Accordingly, the ratio of the parasitic capacitance of the bit line to the capacitance of the memory cell may preferably be at most 8.

Further, since a latch circuit is included in a memory cell, which is different from DRAM, the capacitance ratio above need not be lower than the that of DRAM. Therefore, the capacitance ratio above is preferably at least 3 and at most 8. As above, since the capacitance ratio can be set larger than DRAM, the acceptable range of the capacitance ratio of the bit line to the memory cell is broader, thus increasing the degree of freedom in designing the bit lines and the memory cell. When destructive reading is performed, the capacitance ratio is not required to satisfy the condition of at least 3 and at most 8.

Next, referring to FIG. 8, an exemplary cross-sectional structure of the memory cell according to the semiconductor memory device according to the present embodiment will be described.

Figure 8:
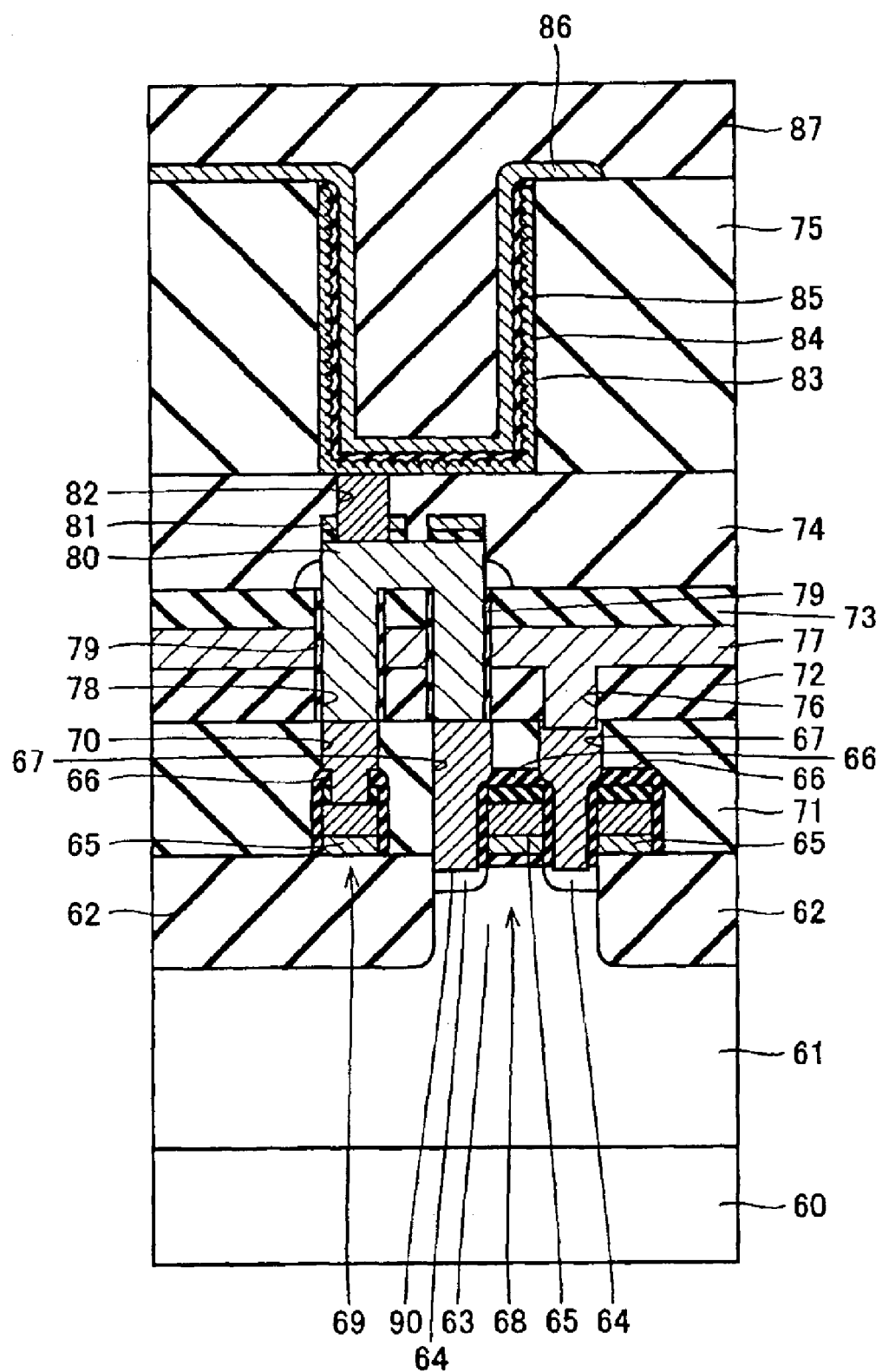
FIG. 8 is a partial cross sectional view of a semiconductor memory device according to the first embodiment of the present invention.

As shown in FIG. 8, p-well region 61 is formed by injecting a p-type impurity into a main surface of a semiconductor substrate 60 such as a silicon substrate. On the surface of p-well region 61, an element separation region 62 is selectively formed. In the example shown in FIG. 8, a trench separation region is formed as the element separation region 62.

On the surface of an active region 63 surrounded by element separation region 62, MOS transistors such as an access nMOS transistor 68 and a driver nMOS transistor 69 are formed. Access nMOS transistor 68 has a pair of n-type impurity regions 64, a gate insulation film, and a gate electrode 65. A pair of n-type impurity regions 64 is formed on the surface of active region 63 separated from each other to act as the source or the drain of access nMOS transistor 68.

An insulation film such as a silicon oxide film is formed on gate electrode 65, and an insulation film 66 formed of silicon nitride film or the like is formed so as to cover that silicon oxide insulation film and gate electrode 65. A first interlayer insulation film 71 is formed, which is structured with a silicon oxide film or the like doped with an impurity, so as to cover insulation film 66. To this first interlayer insulation film 71, a pair of first contact holes 67 reaching the source and the drain of access nMOS transistor 68, respectively, and a second contact hole 70 reaching the gate electrode of driver nMOS Transistor 69 are formed.

In each of first contact holes 67 and second contact hole 70, a plug part formed of a conductive material such as tungsten or the like is formed. A connecting portion between the plug part in one of first contact holes 67 and n-type impurity region (drain) 64 corresponds to a memory node 90.

A second interlayer insulation film 72 is formed on first interlayer insulation film 71, and a third contact hole 76 is formed so as to pass through second interlayer insulation film 72. A bit line 77 formed of tungsten or the like is formed from inside third contact hole 76 and extending on second interlayer insulation film 72.

A third interlayer insulation film 73 is formed on bit line 77. A fourth contact hole 78 is formed so as to pass through third interlayer insulation film 73, bit line 77 and second interlayer insulation film 72. An insulation film 79 is formed on the inner surface of fourth contact hole 78. Inside this insulation film 79, a plug part is formed. Accordingly, the plug part and bit line 77 can be electrically insulated by insulation film 79.

A gate electrode (first conductive layer) 80 of TFT is formed on third interlayer insulation film 73. On gate electrode 80, a TFT body part (second conductive layer) 81 forming the source, drain and channel region of TFT is formed with an insulation film therebetween. A fourth interlayer insulation film 74 is formed so as to cover TFT gate electrode 80 and TFT body part 81.

To this fourth interlayer insulation film 74, a fifth contact hole 82 is formed, which passes through TFT body part 81 and reaches TFT gate electrode 80. A plug part is formed in this fifth contact hole 82, whereby gate electrode 80 of one TFT and TFT body part 81 of the other TFT are electrically connected.

A fifth interlayer insulation film 75 is formed on fourth interlayer insulation film 74. To this fifth interlayer insulation film 75, a trench 83 reaching fourth interlayer insulation film 74 and the plug part inside fifth contact hole 82 is formed.

Inside this trench 83, a capacitor as a capacitive element is formed. On the inner surface of trench 83, a capacitor lower electrode (first electrode) 84 formed of polysilicon or the like is formed so as to be electrically connected to the plug part above. The surface of capacitor lower electrode 84A is processed to be rough, thereby forming multiple protrusions thereon. Thus, the surface area of the capacitor can be increased, and hence, the capacity of the capacitor can be increased.

A capacitor insulation film 85 is formed on capacitor lower electrode 84, and a capacitor upper electrode (second electrode) 86 formed of polysilicon or the like is formed on capacitor insulation film 85. Then, a protective insulation film 87 is formed so as to cover capacitor upper electrode 86.

As above, by arranging bit line 77 below TFT, it is no longer necessary to provide each of TFT and the capacitors with a region for bit line contact. Accordingly, the size of TFT and the capacitors can be increased.

Further, since GND line is formed on the same layer as bit line 77, namely on second interlayer insulation film 72, bit line contact as well as GND line contact will not become too deep. Thus, the contact resistance can be reduced.

Still further, by arranging TFT below the capacitor, the signal line will not pass through the capacitor. Accordingly, the size of the capacitor may not be limited by the signal line, and thus a large size of capacitor can be attained.

Next, description will be made on an exemplary pattern layout of each layer in the memory cell of the semiconductor memory device according to the present embodiment, referring to FIGS. 2–7 in the order ascending from the lowermost layer.

Figure 2:
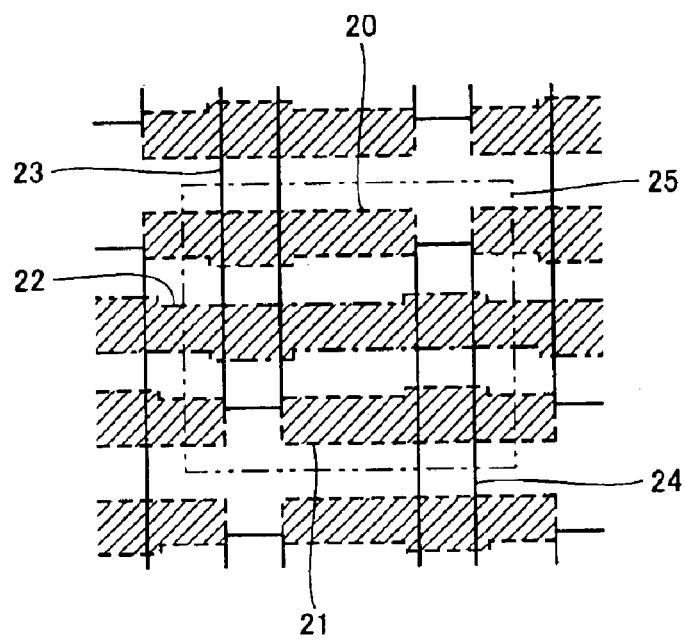
FIG. 2 is a plan view showing an exemplary layout of first interconnection patterns and active region patterns of the memory cell shown in FIG. 1.

In FIGS. 2–7, one memory cell region 25 is shown. As shown in FIG. 2, memory cell region 25 is defined by two fictitious vertical lines and two fictitious horizontal lines. The horizontal line extends on the midpoint between an active region of memory cell region 25 and an active region of a memory cell region adjacent to memory cell region 25 in an extending direction of the word line and extends along the above active region. The vertical line extends on the midpoint between a gate electrode of a driver nMOS transistor of memory cell region 25 and a gate electrode of a driver nMOS transistor of a memory cell region adjacent to memory cell region 25 in an extending direction of the bit line and extends along the gate electrode of the driver nMOS transistor.

As shown in FIG. 2, in one memory cell region 25, first interconnection patterns 20–22, active region patterns 23, 24 are formed. These patterns are each formed by substantially straight lines to have a simple quadrangular shape. First interconnection patterns 20–22 extend substantially parallel to each other, while active region patterns 23, 24 extend in a direction substantially orthogonal to the direction of first interconnection patterns 20–22, and arranged in substantially parallel to each other.

First interconnection patterns 20, 21 correspond to the gate patterns of driver nMOS transistors, while first interconnection pattern 22 corresponds to a word line and the gate pattern of access nMOS transistor. This first interconnection pattern 22 is arranged at the middle portion of the memory cell. In other words, the word line is arranged in the middle portion of the memory cell.

Active region patterns 23, 24 each include the source, channel and drain regions of a driver nMOS transistor, and the source, channel and drain regions of an access nMOS transistor.

At the intersection of active region pattern 23 and first interconnection pattern 20, one driver nMOS transistor is formed, and immediately under the intersection, the channel region of the driver nMOS transistor is positioned. At the intersection of active region pattern 23 and first interconnection pattern 22, one access nMOS transistor is formed, and immediately below the intersection, the channel region of the access nMOS transistor is positioned.

Similarly, at the intersection of active region pattern 24 and first interconnection pattern 21, the other driver nMOS transistor is formed, and immediately below the intersection, the channel region of the driver nMOS transistor is positioned. At the intersection of active region pattern 24 and first interconnection pattern 22, the other access nMOS transistor is formed, and immediately below the intersection, the channel region of the access nMOS transistor is positioned.

As above, by extending first interconnection patterns 20–22 in the same direction, a memory cell may be extended in the extending direction of a word line. Since a bit line extends in the direction orthogonal to a word line, the length of a memory cell will be shorter in the extending direction of the bit line than in the extending direction of the word line. Accordingly, by employing the layout above, bit line length per one memory cell can be reduced. Thus, bit line capacitance per one bit can be reduced, accelerating the speed of reading and writing operations.

Generally, a sense amplifier is provided for a certain bit line length. By employing the layout above, the number of memory cells can be increased in the extending direction of the bit line, hence the number of sense amplifiers can be reduced. Accordingly, the peripheral circuitry may be simplified. This may also contribute to the reduction of the chip size.

Further, since the gate width of driver nMOS transistors and that of access nMOS transistors are approximately the same, active region patterns 23, 24 can be formed as simple quadrangular patterns. Thus, the manufacturing variations in the form or in the position of active region patterns 23, 24 can be avoided and active region patterns 23, 24 may easily be formed at high accuracy.

Further, all the patterns can be positioned in a point symmetry relative to the center of memory cell region 25. Thus, for example, driver nMOS transistors or access nMOS transistors can be set with a constant interval in the direction of the word line. Accordingly, the factor of variations in processes equally affects four MOS transistors, thereby maintaining the performance of the four MOS transistors equal.

Still further, first interconnection patterns 20, 21 corresponding to the gates of driver nMOS transistors are protruding into the adjacent memory cell in the extending direction of the word line. Thus, off-state current in MOS transistors can be reduced. Additionally, intervals of first interconnection patterns 20, 21 in one memory cell and that in adjacent memory cell can be set constantly, thus the finished state of first interconnection patterns 20, 21 after the process of patterning can be maintained uniformly.

Figure 3:
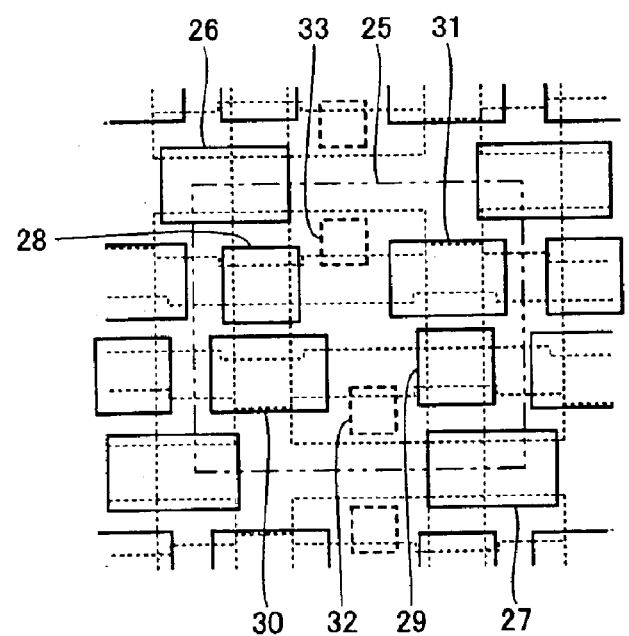
FIG. 3 is a plan view showing an exemplary layout of first and second contact hole patterns of the memory cell shown in FIG. 1.

As shown in FIG. 3, in a layer above first inter connection patterns 20–22 and active region patterns 23, 24, first contact hole patterns (contact pans) 26–31 and second contact hole patterns (contact parts) 32, 33 are formed.

First contact hole patterns 26, 27 are the patterns of contact holes each connecting the source of driver nMQS transistor and an upper layer interconnection, first contact hole patterns 28, 29 are the patterns of contact holes each connecting active region corresponding to a memory node and an upper layer interconnection, first contact hole patterns 30, 31 are the patterns of contact holes each connecting an access MOS transistor and a bit line, and second contact hole patterns 32, 33 are the patterns of contact holes each connecting the gate of driver nMOS transistor and an upper layer interconnection.

First contact hole patterns 26–31 are the patterns of the contact holes forming a self-aligned contacts. Each of the contact holes for self-aligned contacts is formed close to but not reaching the gate of each MOS transistor, and a polysilicon to be a plug part is buried therein like a pile. Second contact hole patterns 32, 33 are formed separate from first contact hole patterns 26–31, and a polysilicon to be a plug part is also buried therein like a pile.

Figure 4:
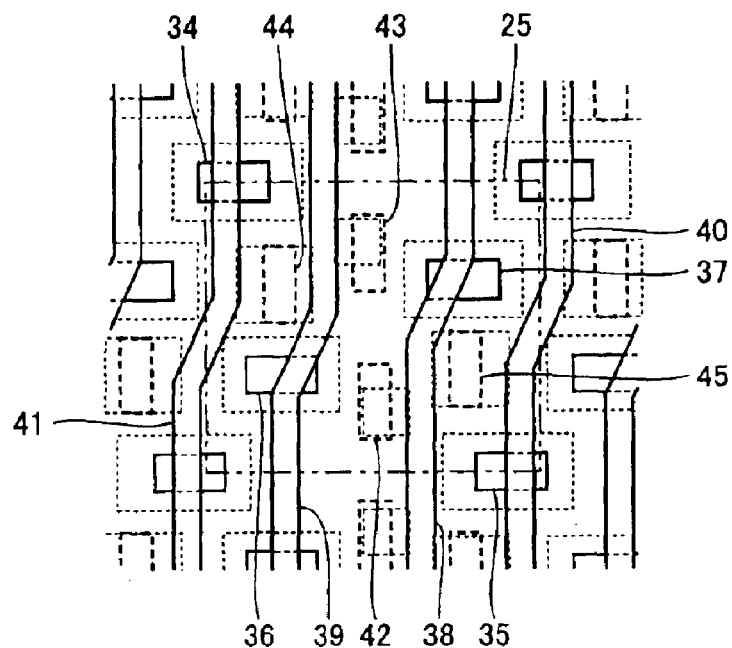
FIG. 4 is a plan view showing an exemplary layout of third and fourth contact hole patterns and second interconnection patterns of the memory cell shown in FIG. 1.

As shown in FIG. 4, in a layer above first contact hole patterns 26–31 and second contact hole patterns 32, 33, second interconnection patterns 38–41, third contact hole patterns (contact parts) 34–37 and fourth contact hole patterns (contact parts) 42–45 are formed.

Third contact hole patterns 34–37 are arranged on the polysilicon plugs that are formed in first contact hole patterns 26, 27, 30, 31, and connected to second interconnection patterns 38–41.

Second interconnection patterns 38–41 are, for example, tungsten interconnection patterns, in which second interconnection patterns 38, 39 correspond to bit lines and second interconnection patterns 40, 41 correspond to GND lines. Accordingly, third contact hole patterns 34, 35 correspond to GND line contact parts, while third contact hole patterns 36, 37 correspond to bit line contact parts.

It should be noted that, in order to limit the amount of current flowing into a memory node, the impurity concentration in the active region below the bit line contact part is preferably set lower than that in the active region below the GND line contact part. Further, it is possible to limit this amount by setting the area of the bit line contact part smaller than that of the GND line contact part.

As shown in FIG. 4, a pair of GND lines are provided with a pair of bit lines arranged therebetween. In other words, GND lines are arranged at opposing sides of a pair of bit lines. Thus, a shield effect by the GND lines can be attained. Accordingly, the tolerability against the noise from the bit lines of adjacent memory cells can be improved.

Further, by extending GND lines in the direction orthogonal to the extending direction of word lines, when one word line is selected, currents from memory cells connected to that word line to GND line will flow into respective GND lines each connected to a memory cell. Thus, currents from all memory cells connected to one word line will not be centered to a particular GND line, preventing the GND level in a memory cell from rising. Thus, the data inversion incurred by increased GND level can be avoided.

Still further, in the layout above, memory cells adjacent to each other in the extending direction of a word line each have an independent GND contact, and not sharing a GND contact. GND level tends to rise when such adjacent memory cells share a GND contact. As such, by arranging memory cells adjacent to each other in the extending direction of a word line not to share GND contact, it will be possible to prevent GND level of memory cells from increasing.

Fourth contact hole patterns 42, 43 are positioned on second contact hole patterns 32, 33. Plug parts formed in fourth contact hole patterns 42, 43 and plug parts formed in second contact hole patterns 32, 33 are electrically connected.

Fourth contact hole patterns 44, 45 are positioned on first contact hole patterns 28, 29. Plug parts formed in fourth contact hole patterns 44, 45 and plug parts formed in first contact hole patterns 28, 29 are electrically connected.

Figure 5:
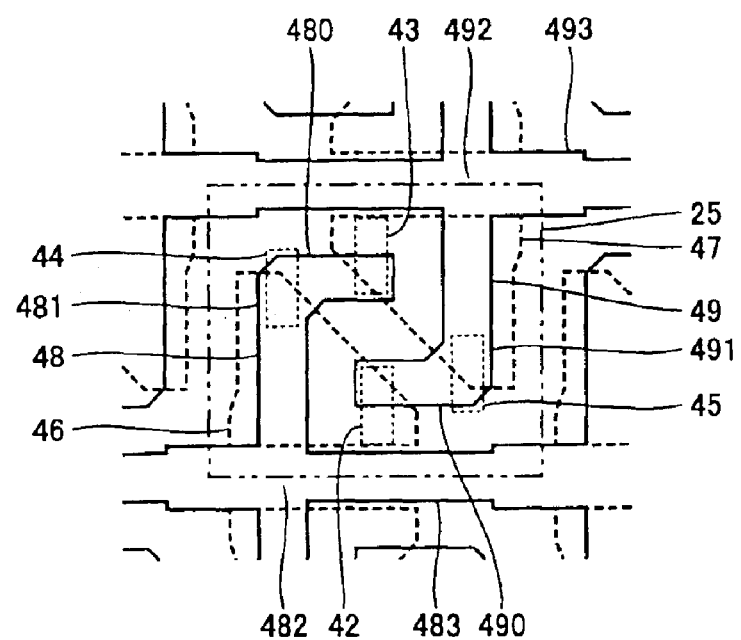
FIG. 5 is a plan view showing an exemplary layout of third and fourth interconnection patterns of the memory cell shown in FIG. 1.

As shown in FIG. 5, in a layer above second interconnection patterns 38–41, third contact hole patterns 34–37 and fourth contact hole patterns 42–45 as described above, third interconnection patterns 46, 47 and fourth interconnection patterns 48, 49 are formed. TFTs are formed by these third interconnection patterns 46, 47 and fourth interconnection patterns 48, 49.

Third interconnection patterns 46, 47 are formed by, for example, polysilicon, and each serve as a cross-coupling interconnection as well as a gate electrode of TFT. Plug parts in fourth contact hole patterns 43, 45 are electrically connected to third interconnection pattern 47. Therefore, third interconnection pattern 47 is connected to first interconnection pattern (the gate electrode of the driver transistor) 20 and a memory node on active region 24 via first contact hole pattern 29 and second contact hole pattern 33.

Plug parts in fourth contact hole patterns 42, 44 are electrically connected to third interconnection pattern 46. Therefore, third interconnection pattern 46 is connected to first interconnection pattern (the gate electrode of the driver transistor) 21 and a memory node on active region 23 via first contact hole pattern 28 and second contact hole pattern 32.

As shown in FIG. 5, third interconnection patterns 46, 47 are in substantially triangular shape. Preferably, third interconnection patterns 46, 47 are each designed to have a shape similar to a regular triangle. Thus, the resistance of cross coupling interconnections of the inverters can be reduced, while maintaining the channel length of TFTs.

Figure 9:
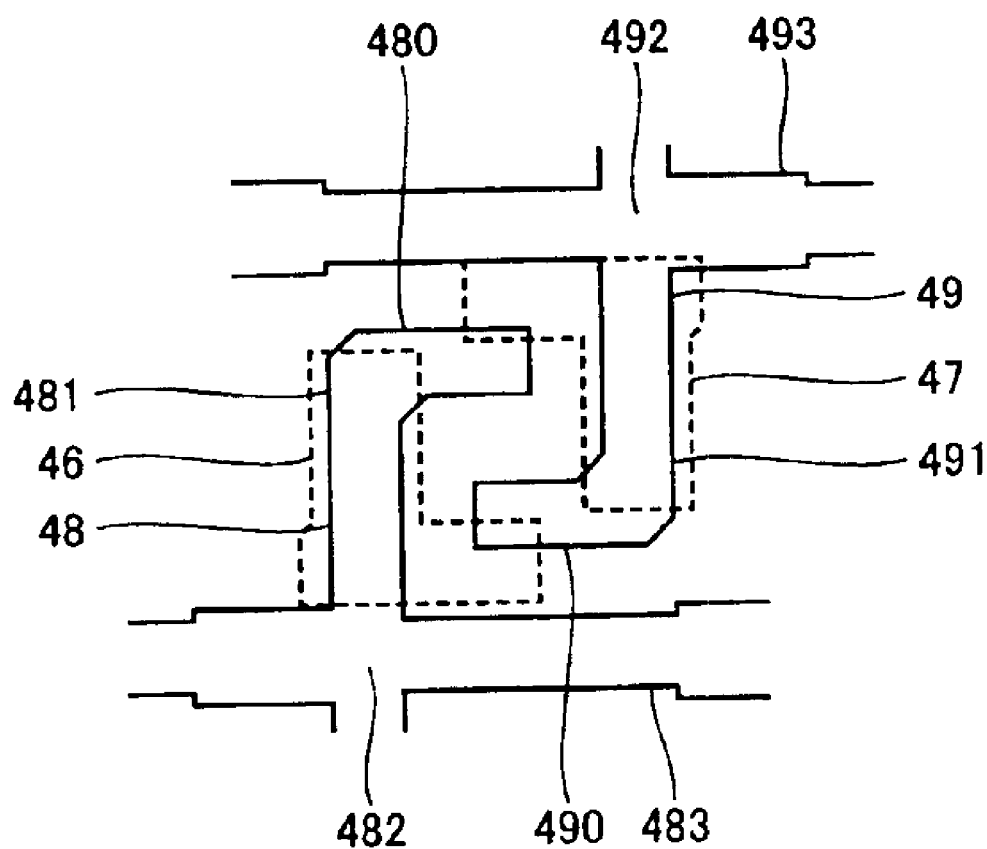
FIG. 9 is a plan view showing another exemplary form of third and fourth interconnection patterns.
Figure 10:
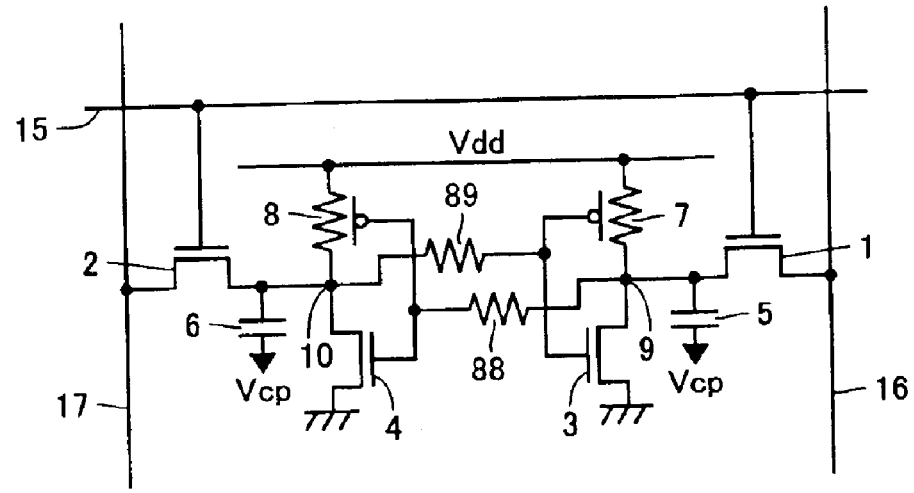
FIG. 10 is an equivalent circuit diagram of a memory cell with redundant resistor components being added between cross-coupling interconnections of inverters.

On the other hand, if third interconnection patterns 46, 47 are formed as L-shaped patterns as shown in FIG. 9, then the length of the cross-coupling interconnections of the inverters will become longer. Accordingly, the equivalent state shown in FIG. 10 will be invited, where redundant resistance components 88, 89 are added in the cross-coupling interconnections of the inverters, whereby a writing operation is delayed.

Fourth interconnection patterns 48, 49 are, for example, formed by polysilicon, and include drain regions 480, 490, channel regions 481, 491, source regions 482, 492, and Vdd interconnection parts 483, 493 of TFT, respectively. Vdd interconnection parts 483, 493 extend in the same direction as a word line.

Figure 6:
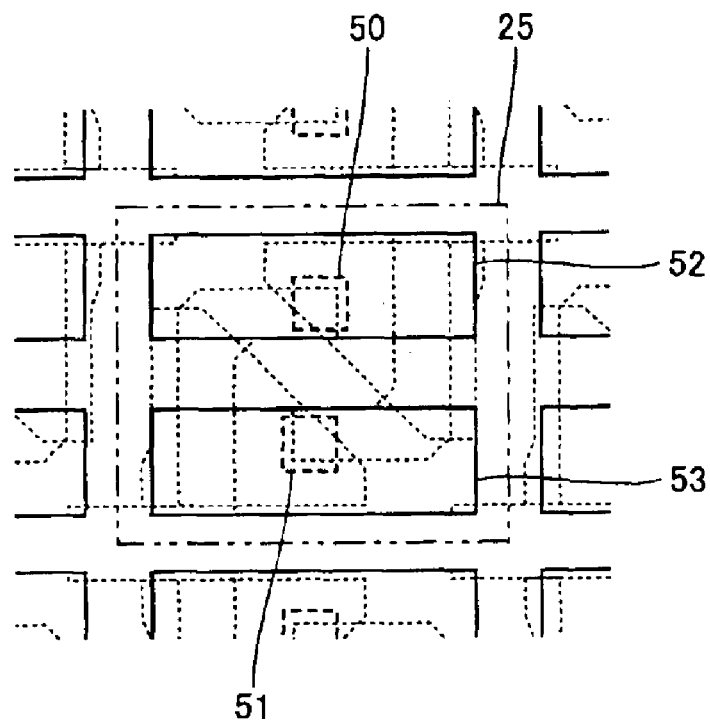
FIG. 6 is a plan view showing a layout pattern of fifth contact hole patterns and capacitor patterns of the memory cell shown in FIG. 1.

Drain regions 480, 490 are electrically connected to third interconnection patterns 46, 47 via plug parts in fifth contact hole patterns 50, 51 shown in FIG. 6. Thus, the gate electrode of one TFT is electrically connected to the drain of other TFT, achieving a cross-coupling structure, where output of the other TFT is input to one TFT.

Further, fourth interconnection patterns 48, 49 are each formed in a curved or bent shape so as to extend along the periphery of fifth contact hole patterns 50, 51. More specifically, fourth interconnection patterns 48, 49 are each provided with a part extending orthogonal to the extending direction of a word line (channel part), and a part extending parallel to the extending direction of a word line (drain part), with these parts partially surrounding the drain contact of TFT. By arranging part of fourth interconnection patterns 48, 49 in thus curved shape, the channel length of each TFT can be made longer. As a result, the leakage current when each TFT is turned off can be reduced, and hence, the current consumption for retaining a data can be reduced.

Fifth contact hole patterns 50, 51 and capacitive element patterns 52, 53 are formed as shown in FIG. 6, in a layer above third interconnection patterns 46, 47 and fourth interconnection patterns 48, 49 described above.

Fifth contact hole pattern 50 electrically connects the lower electrode (first electrode) of capacitive element pattern 52 to TFT drain region 480 as well as third interconnection pattern 47. Further, fifth contact hole pattern 51 electrically connects the lower electrode (first electrode) of capacitive element pattern 53 to TFT drain region 490 and third interconnection pattern 46.

An example of capacitive element patterns 52, 53 may be a cylindrical capacitor. In the example shown in FIG. 6, the two-dimensional shape of capacitance element patterns 52, 53 are quadrangular, but it may be any other form such as circle, triangle, square, polygon with five and more corners. Capacitor element patterns 52, 53 each have the lower electrode (first electrode), the capacitor insulation film (dielectric film) and the upper electrode (second ectrode) as described above.

The lower electrodes of capacitive element patterns 52, 53 are electrically connected to third interconnection patterns 46, 47 via fifth contact hole patterns 50, 51, respectively. Therefore, the lower electrodes of capacitive element patterns 52, 53 also function as the gate electrodes of TFTs.

In other words, channel regions 481, 491 of TFTs are sandwiched by the lower electrodes of capacitive element patterns 52, 53 and the gate electrodes of TFTs, whereby TFTs attain a so-called double gate structure. Thus, the ratio of on/off-state currents of TFTs can be improved.

Figure 7:
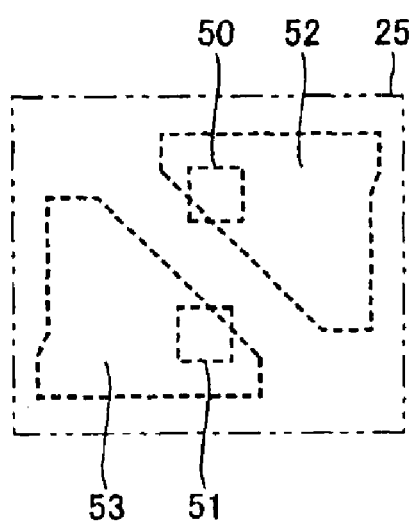
FIG. 7 is a plan view showing another exemplary form of capacitor patterns.

It should be noted that, as shown in FIG. 7, the two-dimensional shape of capacitive element patterns 52, 53 can be designed to be the same as third interconnection patterns 46, 47. In this case, a mask for pattern formation of third interconnection patterns 46, 47 can be utilized when forming capacitive element patterns 52, 53, thereby reducing the number of the masks.

Second Embodiment

Figure 11:
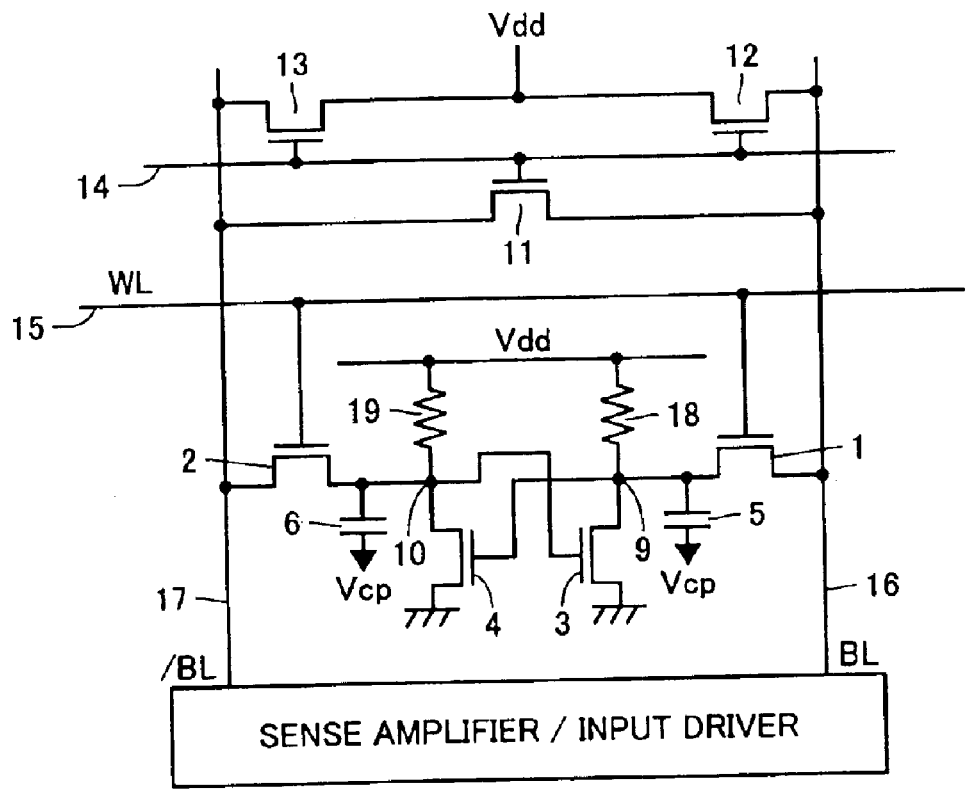
FIG. 11 is an equivalent circuit diagram of a memory cell of a semiconductor memory device according to a second embodiment of the present invention.

Next, referring to FIG. 11, a second embodiment of the present invention will be described. In the first embodiment described above, the example where TFTs are employed as load elements, whereas it is also possible to use resistance elements 18, 19 as load elements.

Polysilicon layer including impurity or the like can be employed as resistance elements 18, 19, for example. By using resistance elements 18, 19 as load elements, the structure of a memory cell can be simplified rather than employing TFTs.

It should be noted that, resistance elements 18, 19 may be formed on the same layer as TFTs, for example on third interlayer insulation film 73 in the example shown in FIG. 8. The rest of the configuration is the same as the first embodiment.

Third Embodiment

Next, a third embodiment of the present invention will be described referring to FIGS. 12–14. In the first embodiment described above, the gates of TFTs are arranged below the interconnections forming the sources and the drains of TFTs (to semiconductor substrate side), whereas they are arranged above the interconnections forming the sources and the drains of TFTs. Thus, the amount of the current when TFTs are on can be increased.

Figure 12:
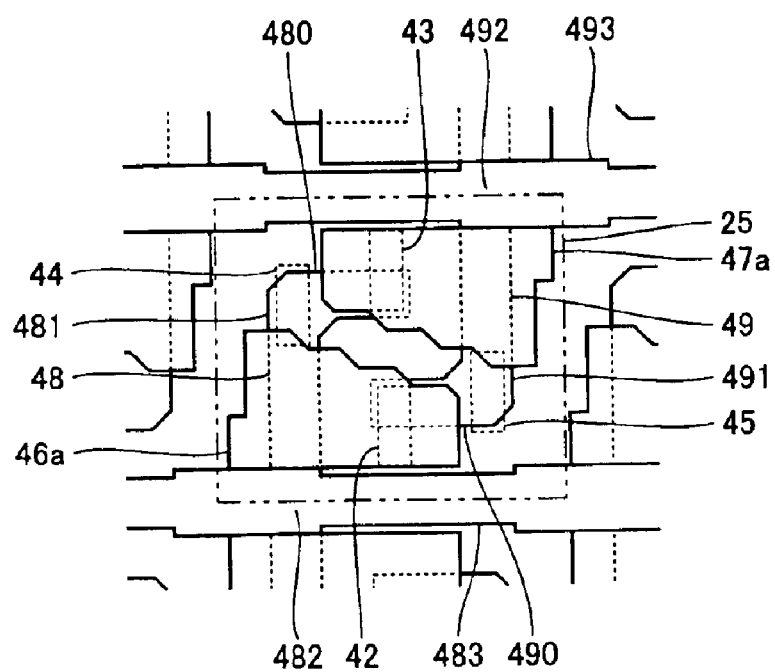
FIG. 12 is a plan view showing an exemplary layout of third and fourth interconnection patterns of a memory cell of a semiconductor memory device according to a third embodiment of the present invention.

As shown in FIG. 12, in the third embodiment, third interconnection patterns 46a, 47a corresponding to the gates of TFTs are formed on a layer above fourth interconnection patterns 48, 49 each including the source region, the channel region, the drain region of TFT and Vdd interconnection. Further, third interconnection patterns 46a, 47a are formed in a conductive layer different from and above the conductive layer where the cross-coupling interconnections are formed.

Further, the shape of third interconnection patterns 46a, 47a are formed different from third interconnection patterns 46, 47 in FIG. 5 and others. Specifically, each hypotenuse of third interconnection patterns 46a, 47a is provided with projections and depressions like a saw-blade.

Figure 13:
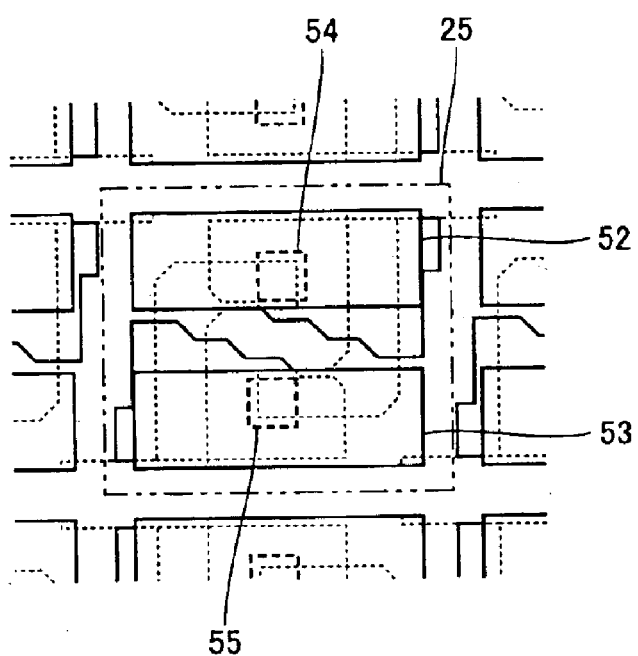
FIG. 13 is a plan view showing an exemplary layout of sixth contact hole patterns and capacitor patterns of the memory cell of the semiconductor memory device according to the third embodiment of the present invention.

As shown in FIG. 13, sixth contact hole patterns 54, 55 are formed on third interconnection patterns 46a, 47a, and capacitive element patterns 52, 53 are formed thereon. Sixth contact hole patterns 54, 55 electrically connect third interconnection patterns 46a, 47a and capacitive element pattern 52, 53, respectively.

Next, referring to FIG. 14, the exemplary cross-sectional structure of the memory cell of the semiconductor memory device according to the third embodiment of the present invention will be described.

Figure 14:
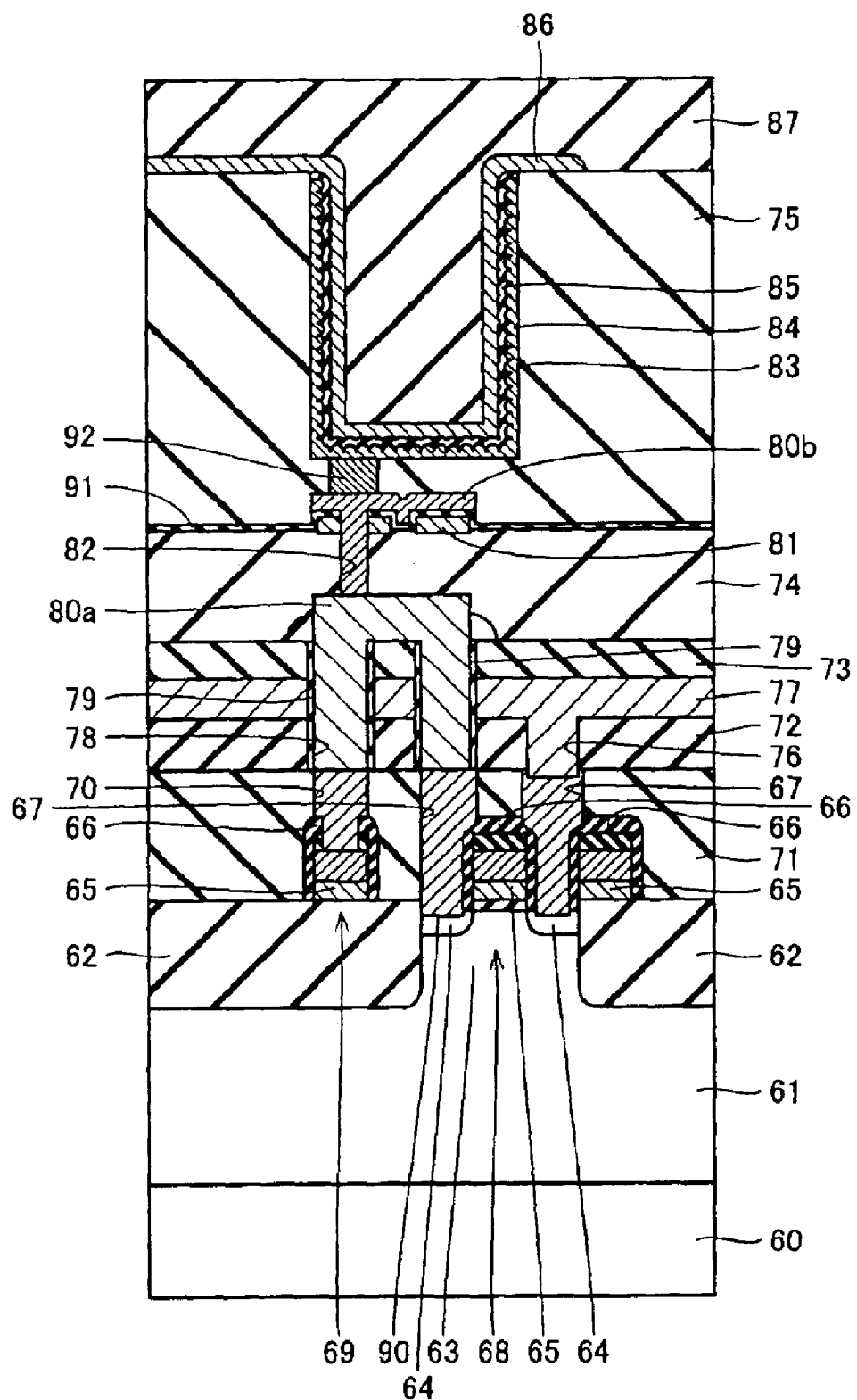
FIG. 14 is a partial cross-sectional view of the semiconductor memory device according to the third embodiment of the present invention.

As shown in FIG. 14, a conductive layer to be TFT body part 81 is formed on fourth interlayer insulating film 74, and insulation film (gate insulation film) 91 such as oxide film is formed on fourth interlayer insulating film 74 so as to extend on TFT body part 81.

Fifth contact hole 82 is formed so as to pass through insulation film 91 and TFT body part 81 and reach conductive layer 80a. This conductive layer 80a functions as a cross-coupling interconnection. A conductive layer such as of doped silicon is formed so as to extend from inside of fifth contact hole 82 to above insulation film 91. Part of this conductive layer forms gate electrode 80b of TFT.

It should be noted that, a plug may be formed separately in fifth contact hole 82, and form a conductive layer that is made of different material from that plug, such that the plug functions as gate electrode 80b of TFT.

Sixth contact hole 92 is formed in fifth interlayer insulation film 75 so as to reach gate electrode 80b of TFT, and a conductive layer is buried in that sixth contact hole 92 to form a plug. Trench 83 reaching the plug is formed on sixth contact hole 92, to electrically connect capacitor lower electrode 84 formed inside trench 83 to the plug inside sixth contact hole 92. The rest of the cross-sectional structure is almost the same as in FIG. 8.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of memory cells arranged in an array, comprising:

a flip-flop of said memory cells having a pair of inverters formed of driver MOS (Metal Oxide Semiconductor) transistors and load elements;

a pair of access MOS transistors of said memory cells electrically connected to input nodes of said inverters respectively;

an interlayer insulation film covering said access MOS transistors and said driver MOS transistors;

a pair of capacitive elements of said memory cells formed on said interlayer insulation film and electrically connected to said input nodes of said inverters;

a word line electrically connected to gate electrodes of said pair of access MOS transistors and extending in the same direction as an extending direction of gate electrodes of said driver MOS transistors and disposed between said gate electrodes of said driver MOS transistors;

a pair of active region patterns formed by integrating a pair of active regions of said access MOS transistors with a pair of active regions of said driver MOS transistors and extending in a direction orthogonal to an extending direction of said word line; and a pair of bit lines extending in a direction orthogonal to the extending direction of said word line and electrically connected to active regions of said access MOS transistors respectively; wherein a length of said memory cells in the extending direction of said word line is longer than that in an extending direction of said bit lines, said bit lines are disposed above said access MOS transistors and said driver MOS transistors, said load elements are disposed above said bit lines, and said capacitive elements are disposed above said load elements.

2. The semiconductor memory device according to claim 1, wherein a gate width of said driver MOS transistor is at least 0.8 times and at most 1.2 times as large as a gate width of said access MOS transistor.

3. The semiconductor memory device according to claim 1, wherein the gate electrode of one of said driver MOS transistors of one of said memory cells and the gate electrode of one of said driver MOS transistors of another memory cell, which is adjacent to said one of memory cells in the extending direction of said word line, are disposed on opposite sides of said active regions of said access MOS transistors which is electrically connected to said bit lines, the gate electrode of said one of driver MOS transistors of said another memory cell extends into said memory cell.

4. The semiconductor memory device according to claim 2, further comprising a pair of ground line, wherein said pair of bit lines is arranged between said ground lines, and said ground lines are extended in the same direction as said bit lines.

5. The semiconductor memory device according to claim 1, wherein said load elements include a thin film transistor respectively, said thin film transistor includes a first conductive layer functioning as a gate electrode, and a second conductive layer including a source region, a channel region and a drain region, said first conductive layer is in a substantially triangular shape, and said second conductive layer is in a curved shape.

6. The semiconductor memory device according to claim 1, wherein said load elements include a thin film transistor respectively, said capacitive elements have first and second electrodes opposing to each other with an insulation film therebetween respectively, and said first electrode functions as a gate electrode of said thin film transistor.

7. The semiconductor memory device according to claim 1, wherein said load elements include a thin film transistor respectively, and a gate electrode of said thin film transistor and said capacitive element are of the same shape.

8. The semiconductor memory device according to claim 1, wherein ratio of parasitic capacitance of said bit line to capacitance of said memory cell is at most 8.

9. The semiconductor memory device according to claim 1, wherein resistance value of a contact part of said bit line and said access MOS transistor is set larger than resistance value of a contact part of said driver MOS transistor and said ground line.

10. The semiconductor memory device according to claim 1, wherein the capacitance of said capacitive elements is at least 10 fF and at most 30 fF.

* * * * *